(12) United States Patent
Donohoe et al.

(10) Patent No.: US 6,387,816 B2
(45) Date of Patent: *May 14, 2002

(54) METHOD AND APPARATUS FOR CONTROLLING THE TEMPERATURE OF A GAS DISTRIBUTION PLATE IN A PROCESS REACTOR

(75) Inventors: Kevin G. Donohoe; Guy T. Blalock, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/944,503

(22) Filed: Aug. 30, 2001

Related U.S. Application Data

(60) Continuation of application No. 09/514,820, filed on Feb. 28, 2000, now Pat. No. 6,323,133, which is a division of application No. 09/026,246, filed on Feb. 19, 1998, now Pat. No. 6,132,552.

(51) Int. Cl.[7] .......................... H01L 21/00; H05H 1/00; C23C 16/00
(52) U.S. Cl. ........................................ 438/710
(58) Field of Search ................. 438/710, 689, 438/706; 156/345; 118/723 I, 723 IR

(56) References Cited

U.S. PATENT DOCUMENTS

| 4,348,577 A | 9/1982 | Toyoda et al. |
| 5,017,404 A | 5/1991 | Paquet et al. |
| 5,500,076 A | 3/1996 | Jerbic |
| 5,576,626 A | 11/1996 | Turner et al. |
| 5,597,439 A | 1/1997 | Salzman |
| 5,620,523 A | 4/1997 | Maeda et al. |
| 5,792,261 A | 8/1998 | Hama et al. |
| 6,132,552 A | 10/2000 | Donohoe et al. |

FOREIGN PATENT DOCUMENTS

| JP | 611-125133 A | 6/1986 |
| JP | 4-192328 A | 7/1992 |
| JP | 11-67737 A | 3/1999 |
| JP | 00-100742 A | 4/2000 |

*Primary Examiner*—Gregory Mills
*Assistant Examiner*—P. Hassanzadeh
(74) *Attorney, Agent, or Firm*—TraskBritt

(57) ABSTRACT

A plasma process reactor is disclosed that allows for greater control in varying the functional temperature range for enhancing semiconductor processing and reactor cleaning. The temperature is controlled by splitting the process gas flow from a single gas manifold that injects the process gas behind the gas distribution plate into two streams where the first stream goes behind the gas distribution plate and the second stream is injected directly into the chamber. By decreasing the fraction of flow that is injected behind the gas distribution plate, the temperature of the gas distribution plate can be increased. The increasing of the temperature of the gas distribution plate results in higher $O_2$ plasma removal rates of deposited material from the gas distribution plate. Additionally, the higher plasma temperature aids other processes that only operate at elevated temperatures not possible in a fixed temperature reactor.

5 Claims, 3 Drawing Sheets

METHOD AND APPARATUS FOR CONTROLLING THE TEMPERATURE OF A GAS DISTRIBUTION PLATE IN A PROCESS REACTOR

CROSS-REFERENCE TO RELATED APPLICATIONS

This application is a continuation of application Ser. No. 09/514,820, filed Feb. 28, 2000, now U.S. Pat. No. 6,323, 133B1, which is a divisional of application Ser. No. 09/026, 246, filed Feb. 19, 1998, now U.S. Pat. No. 6,132,552, issued Oct. 17, 2000.

BACKGROUND OF THE INVENTION

The present invention relates generally to process reactors used in fabricating semiconductor devices and, more particularly, to the control of the plasma temperature within the process reactor for improved reactor fabrication and maintenance operations. Plasma process reactors are used for both etching and depositing material on the surface of the semiconductor substrate. In either case, a gas is injected into the chamber of the process reactor where it is ionized into a plasma for either etching or reacting with the surface of the semiconductor substrate to form a desired pattern thereon. It is important to control the gas distribution into the reactor as well as to control the temperature of the gas in forming the plasma. Process reactors often use a thermally isolated dielectric plate to control the gas distribution into the reactor. The gases are injected into the chamber on the backside of the dielectric plate and pass through gas inlet holes in the plate to get into the reaction zone.

The plate is thermally isolated because a backside gap is required to allow the process gases to flow behind the plate to the gas inlet holes. This makes the plate temperature and gas temperature difficult to control as the process puts a heat load on the plate.

Attempts have been made to control the temperature by controlling the temperature of the dielectric plate. Methods of adjusting or controlling the temperature have been performed by adjusting the backside gap to be as small as possible, by controlling the temperature of the reactor wall located behind it, or by cooling the dielectric plate, or any combination of the three. The heat transfer between the plate and the temperature control reactor wall occurs by conduction of the process gas as it flows through the narrow gap. The gas pressure, and not its flow rate, controls how much heat is transferred between the two surfaces. The plate temperature is controlled by the gas pressure, the reactor wall temperature, and the heat load on the plate from the process chamber.

A sample plasma process reactor 10 is depicted in the schematic diagram of FIG. 1. Plasma process reactor 10 includes a plasma chamber 12 in which is positioned a substrate holder 14. A semiconductor substrate 16 is placed on substrate holder 14. A bias voltage controller 18 is coupled to substrate holder 14 in order to bias the voltage to counter the charges building up on substrate 16. An etching gas is provided through gas inlet 20, which is ionized by inductor backside 22. Placed upon inductor backside 22 is a plurality of inductor elements 24 that is controlled by a current 26. Current 26 causes an induction current to flow that generates an ionizing field on the interior surface of backside 22. The plasma then passes through a gas distribution plate 28, which is held in place with a vacuum seal via O-ring 30, allowing a gas to pass through a plurality of apertures 32. A second O-ring 34 is placed between the backside 22 and gas distribution plate 28. A vacuum is created by a vacuum pump 36 for evacuating material and pressure from chamber 12. A control gate 38 is provided to allow a more precise control of the vacuum as well as the evacuated material. An outlet 40 removes the material from the vacuum for disposal.

In this example, gas distribution plate 28 is made of a silicon nitride material. In certain desired oxide etch processes, it is required that the gas distribution plate 28 be cooled below 80° C. This cooling is accomplished by cooling the reactor wall of chamber 12 and is sometimes called a window in this plasma etch reactor. The reactor wall is cooled to about 20° C. and the process gas is run through the backside gap. Unfortunately, the temperature of the gas distribution plate 28 cannot be easily modified in this arrangement. The inability to control the temperature causes other problems during different stages of use of the process reactor.

One problem is that cleaning of the interior cannot be easily performed since the temperature is fixed as the gas distribution plate is thermally coupled to the reactor wall during cleaning. It is helpful to run the cleaning process at much higher temperatures than during the etching process, but such an effective cleaning temperature cannot be achieved since the temperature is controlled by the constant gas flow at the gas distribution plate. Another problem is that process modifications cannot be performed since only a set maximum temperature is possible and no higher temperature is available that would allow different processes to be performed that require hotter temperatures than those otherwise possible in a fixed-temperature reactor.

Accordingly, what is needed is a method and apparatus that overcome the prior problem of being unable to vary the temperature range of the process reactor for providing greater control over the process occurring in the processor reactor. The inability to vary the temperature range also hinders the cleaning ability of the reactor.

SUMMARY OF THE INVENTION

According to the present invention, a plasma process reactor is disclosed that allows for greater control in varying the functional temperature range for enhancing semiconductor processing and reactor cleaning. The temperature is controlled by splitting the process gas flow from a single gas manifold that injects the process gas behind the gas distribution plate into two streams where the first stream goes behind the gas distribution plate and the second stream is injected directly into the chamber. By decreasing the fraction of flow that is injected behind the gas distribution plate, the temperature of the gas distribution plate can be increased. The increasing of the chamber temperature results in higher $O_2$ plasma cleaning rates of the deposits on the hotter surfaces. Additionally, where other processes would benefit from warmer gas distribution temperatures, the high gas flow allows higher temperatures to be achieved over the non-split flow of the prior art.

DETAILED DESCRIPTION OF THE INVENTION

Figure 2:
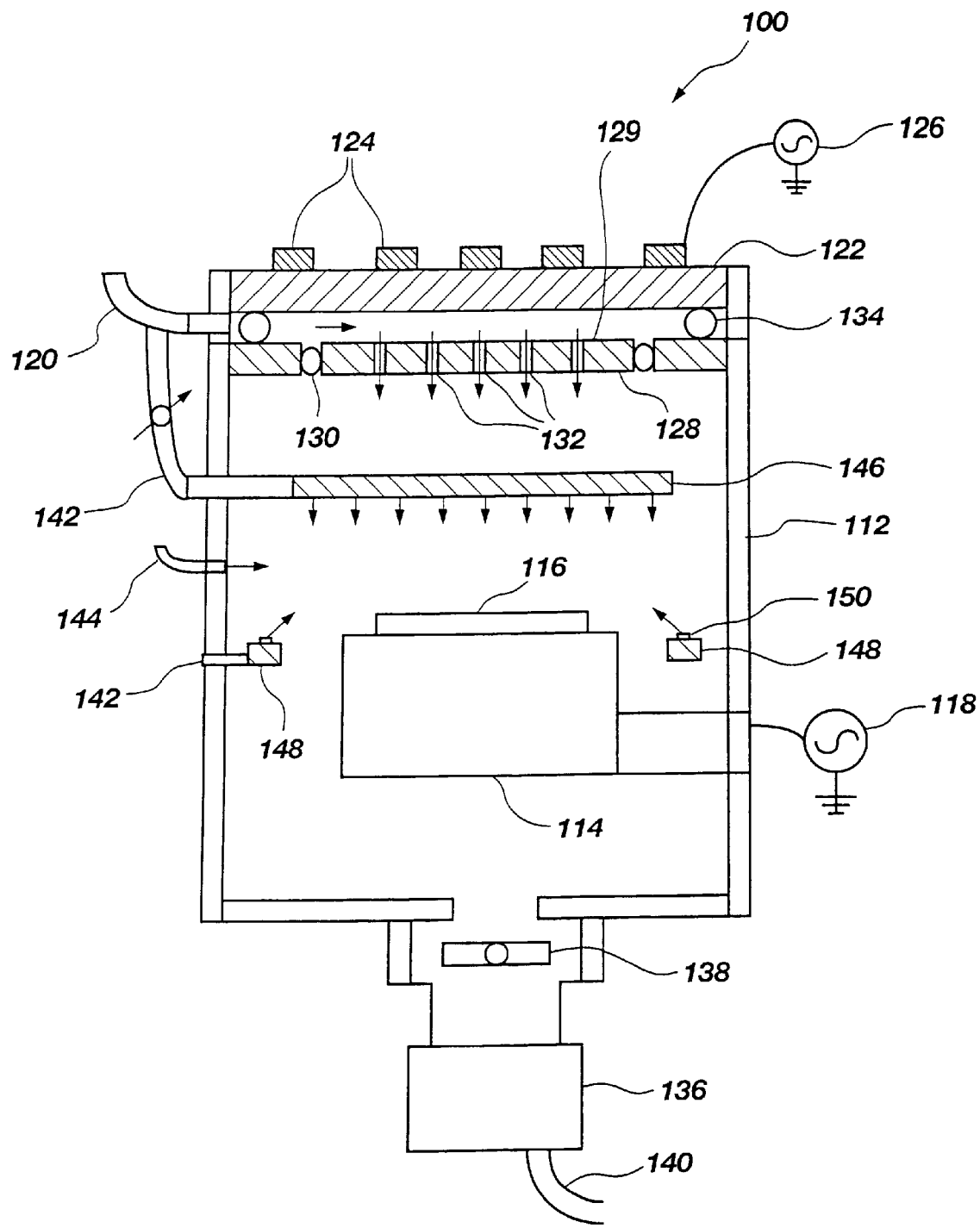
FIG. 2 is a schematic diagram of a plasma process reactor having a split fold plasma manifold and injector according to the present invention.

A high density, plasma process reactor 100 is depicted in the schematic diagram of FIG. 2. The reactor may have multiple plasma sources where one source is for etching layers in a semiconductor substrate while the other source is for depositing a polymer. Reactor 100 is a low pressure reactor that operates at or below 50 milliTorr. Low pressure reactors are desired as they avoid microscopic loading, where features of the same size etch more slowly in dense patterns than in sparse patterns. The reactor 100 has separate controls for top and bottom power. The top power is for energizing high density plasma sources and the bottom power or bias source is for directing the plasma for etching and for directing a polymer for depositing. The high density plasma reactor 100 is modeled after an LAM 9100 TCP (transferred coupled plasma) etcher and an Applied Materials HDP 5300. High density plasma is defined as plasma having an ion density greater than $1 \times 10^{10}$ per centimeter$^3$ in a plasma generation zone. Typically, high density plasmas range in ion density from $10^{11}$ to $10^{13}$ per cm$^3$.

Figure 1:
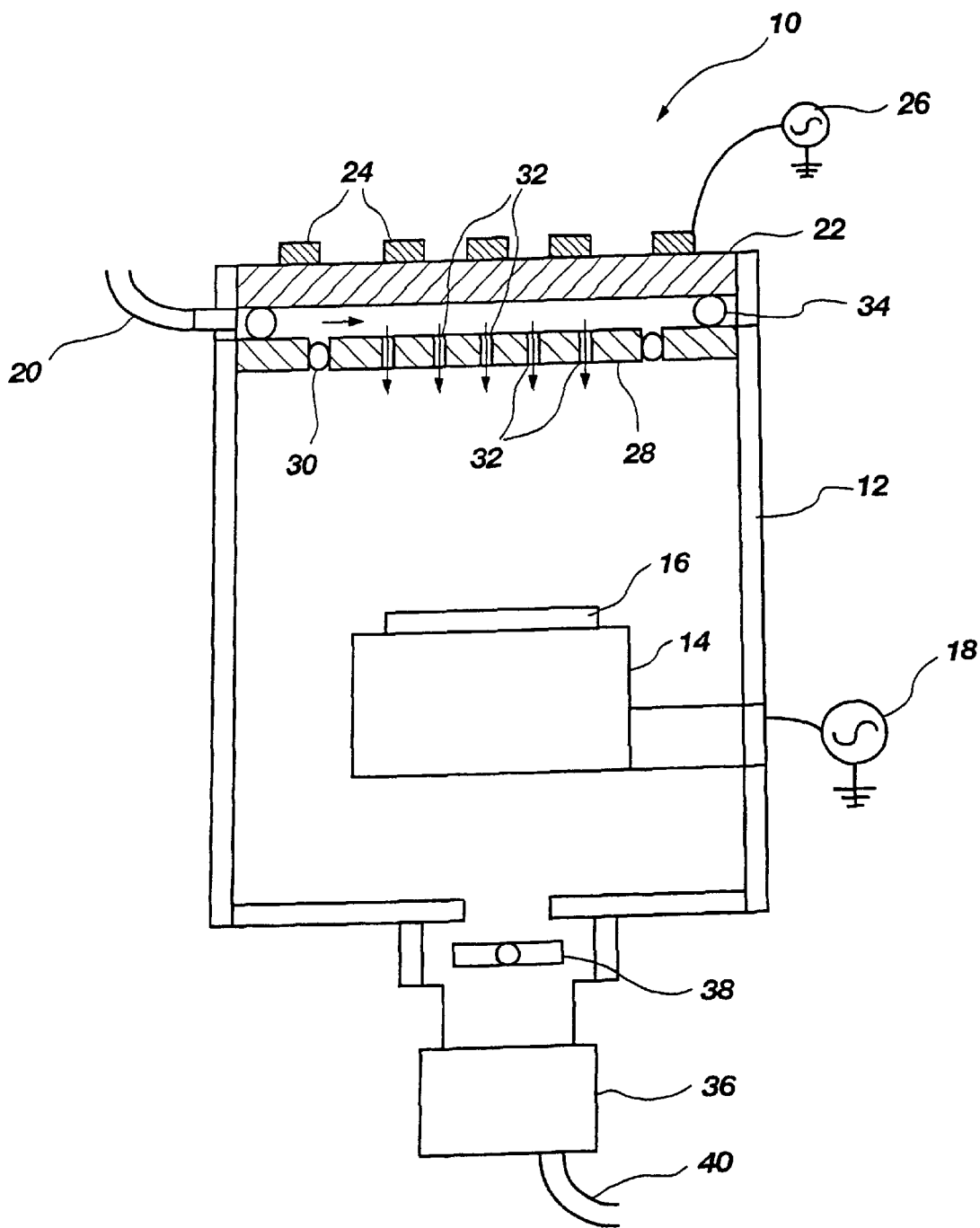
FIG. 1 is a schematic diagram of a plasma process reactor according to the prior art.

Process reactor 100 increases the range of process results capable of being obtained as well as improves the ability to clean the chamber by adding a second process gas flow inlet that avoids gas passing through the gas distribution plate on the backside of the reactor. Reactor 100 is similar in construction to that of the prior art reactor 10 in FIG. 1. Reactor 100 includes a chamber 112 in which is placed a substrate support platform 114 that holds semiconductor substrate material 116. A plurality of substrates 116 can be placed upon support platform 114. The bottom bias source is controlled by voltage supply 118 that either grounds platform 114 or holds it at a selected voltage to attract the plasma generated within reactor 100. A first process gas inlet 120 is provided that feeds process gas within a chamber formed by reactor backside 122 and gas distribution plate (or dielectric) 128. Gas distribution plate 128 further includes a dielectric layer 129, placed on the backside 122 of plate 128.

A plurality of inductive power sources 124, which is controlled by power supply 126, is mounted to the backside 122 for inductively coupling energy to form the plasma that is emitted through apertures 132 in gas distribution plate 128. A first O-ring 130 is used to seal gas distribution plate 128 in place within chamber 112 and a second O-ring 134 is used to form the chamber between backside 122 and gas distribution plate 128. Process reactor 100 further includes a second process gas inlet 142 as well as an auxiliary oxygen inlet 144; both inlets provide gas flow into chamber 112 and thus bypass gas distribution plate 128. By splitting the process gas flow into chamber 112 via first inlet 120 and second inlet 142, the fractional flow decreases that flows behind the gas distribution plate 128, thus allowing the temperature of plate 128 to increase. Inlets 120, 142, and 144 can be controlled by a mechanical valve (not shown) that is electronically controlled to open and close at different times.

The second inlet 142 actually feeds into a distribution ring 146. In the embodiment of FIG. 2, a pair of distribution rings 146, 148 are placed within the reactor, one above substrate 116 and another substantially coplanar to substrate 116. In using distribution ring 146, it is an annular ring with gas vents that point downwardly towards substrate 116. The ring 146 is annular and thus provides a radial gas flow symmetrical to the substrate 116. The alternative ring 148, which may be used in tandem with the first ring, has jets 150 that direct the gas flow upward and radially inward for uniform distribution to substrate 116.

The use of the additional inlet valves allows reactor 100 to improve its cleaning ability as well as provide process modifications. When the process gas is 100% injected through the side, the cooling of the dielectric layer 129 on plate 128 diminishes and the $O_2$ plasma can now clean deposits from the gas distribution plate 128 because it is thermally uncoupled from the reactor backside 122 during the cleaning step. Further, residue, such as fluorocarbon polymers, is quickly and more efficiently cleaned off of gas distribution plate 128 because of the higher temperature.

Process modifications are possible now in that if conditions require high gas flows to occur but also require a warmer gas distribution plate, the split flow allows the plate to operate at higher temperatures than the prior method of just passing process gas through gas distribution plate 128.

Importantly, the change in gas temperature is inversely-proportional to the change in pressure within chamber 112. Accordingly, by reducing the pressure behind gas distribution plate 128, the temperature of the gas flow can increase by bypassing gas distribution plate 128.

Figure 3:
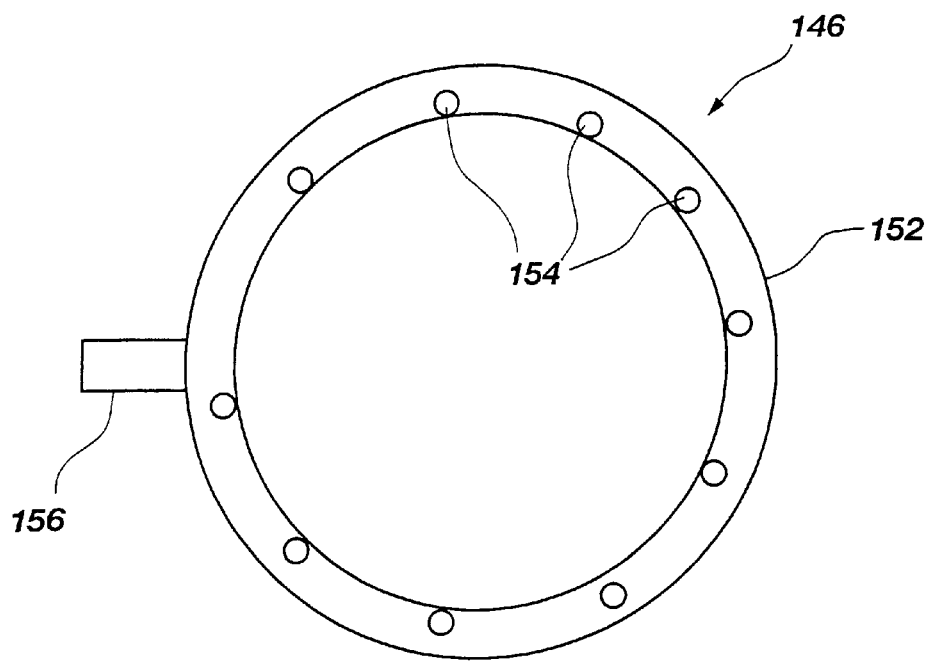
FIG. 3 is a schematic diagram of a top plan view of a gas distribution ring providing the secondary gas flow into the chamber.
Figure 4:
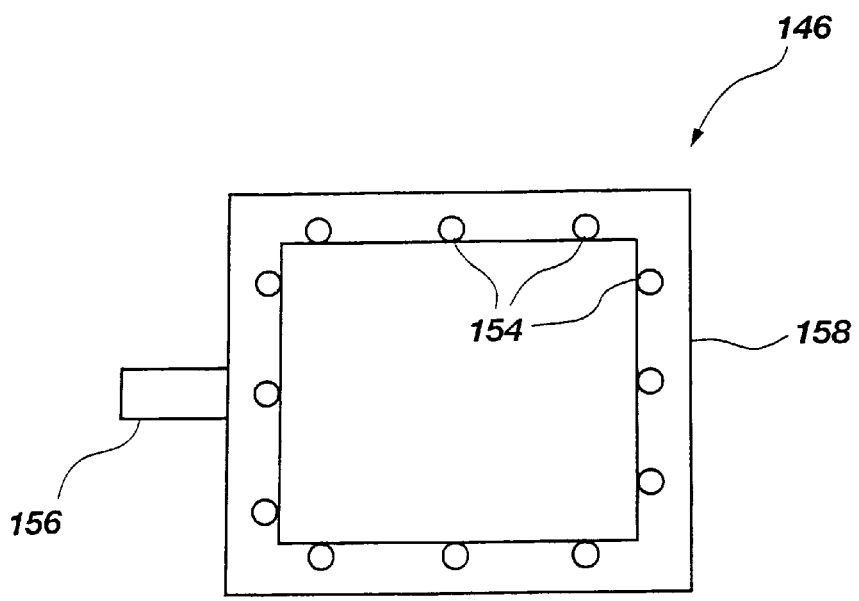
FIG. 4 is an alternative embodiment of the gas flow ring used in the plasma process reactor of FIG. 2.

FIG. 3 is a bottom plan view of a second inlet gas distribution ring 146. Ring 146 includes an annular gas vent 152 that has a plurality of holes 154 distributed around the inner perimeter. The holes can be directed to point either perpendicular to the plane of distribution ring 146 or to point slightly inwardly radially towards the axis of the annular gas vent 152. An inlet connector 156 is provided to attach distribution ring 146 to the interior of chamber 112. FIG. 4 depicts an alternative embodiment of the ring 146. In this embodiment, distribution ring 146 has a square or polygonal shaped gas vent 158. A plurality of holes 154 is provided along the bottom surface of gas vent 158. Again, a connector 156 is provided to connect distribution ring 146 to the second inlet 142 within chamber 112. Either ring of FIG. 3 or FIG. 4 can be placed in the position of ring 146 in FIG. 2. Additionally, either ring can be placed in a position of distribution ring 148 having jets 150 that are substantially coplanar with the substrate 116.

Referring back to the cleaning operation used to clean process reactor 100, the oxygen is introduced at a partial pressure shown in Table I below:

TABLE I

| GASES | FLOWS (sccm) | PRESSURE AT GAS DISTRIBUTION PLATE 128 (Torr) | CHAMBER PRESSURE (mTorr) |
|---|---|---|---|
| $C_2HF_5$ | 15 | 30–40 | 5–50 |
| $N_2$ | 5 | | |
| $CHF_3$ | 15 | | |
| $CH_2F_2$ | 15 | | |

The approximate temperature behind the gas distribution plate 128 is $T_{128}$ =80° C. For another example, if the gas flow is split equally (50/50) between the gas distribution plate 128 and the secondary inlet 142, the pressure behind plate 128 is between 15–20 Torr, with a temperature approximately $T_{128}$=110° C. As the flow increases at the second process gas inlet valve 142, the temperature can increase from 50° to 250° C., Table II provides the values for when the flow is either 100% through inlet 120 or inlet 142:

TABLE II

| PRESSURE | 100% through Inlet 120 | 100% through Inlet 142 |
| --- | --- | --- |
| Behind Plate 128 | 30–500 mTorr | 5–500 mTorr |
| In Chamber | 5–500 mTorr | 5–500 mTorr |

The chamber pressure is independent of the pressure behind gas distribution plate 128. The pressure for 100% of the flow through inlet 120 is dependent on $O_2$ flow rates shown in Table I.

The present invention may be employed to fabricate a variety of devices such as, for example, memory devices. These other devices are not necessarily limited to memory devices but can include applications specific integrated circuits, microprocessors, microcontrollers, digital signal processors, and the like. Moreover, such devices may be employed in a variety of systems, such systems including, but not limited to, memory modules, network cards, telephones, scanners, facsimile machines, routers, copying machines, displays, printers, calculators, and computers, among others.

Although the present invention has been described with reference to a particular embodiment, the invention is not limited to the described embodiment. The invention is limited only by the appended claims, which include within their scope all equivalent devices or methods which operate according to the principles of the invention as described.

What is claimed is:

1. A method of controlling a temperature of a plasma within a plasma process reactor comprising:

splitting a process gas flow from a single gas stream into first and second gas flow streams;

introducing the first gas flow stream into a first region of the plasma process reactor; and introducing the second gas flow stream into a second region of the plasma process reactor, said introducing the second gas flow stream into the second region substantially bypassing the first region.

2. The method of claim 1, wherein the first and second gas flow streams are each introduced as a fraction of the process gas flow from the single gas stream, the method further comprising:

varying a temperature within at least one of the first and second regions by varying a fraction of the process gas flow which flows into the first region.

3. The method of claim 2, wherein a partial pressure is formed in the first region such that the temperature of the plasma increases as the partial pressure decreases.

4. The method of claim 1, further comprising evacuating the plasma process reactor.

5. The method of claim 1, wherein when the second gas flow stream is introduced into the second region substantially bypassing the first region, a temperature of surfaces cooled by gases in the first region increases.

* * * * *